(12) United States Patent
Saunders et al.

(10) Patent No.: US 10,381,287 B1
(45) Date of Patent: Aug. 13, 2019

(54) HEAT SINK INTERFACE FOR A DEVICE

(71) Applicant: Mentor Graphics Corporation, Wilsonville, OR (US)

(72) Inventors: Spencer Saunders, Bedfordshire (GB); Terry Goode, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 15/885,070

(22) Filed: Jan. 31, 2018

(51) Int. Cl.
*H05K 7/20* (2006.01)
*H01L 23/34* (2006.01)
*B65B 63/08* (2006.01)
*B65B 3/04* (2006.01)
*H01L 23/373* (2006.01)
*H01L 23/40* (2006.01)
*F16J 15/06* (2006.01)
*H05K 9/00* (2006.01)

(52) U.S. Cl.
CPC ........ *H01L 23/3735* (2013.01); *F16J 15/064* (2013.01); *H01L 23/3737* (2013.01); *H01L 23/40* (2013.01); *H05K 9/0015* (2013.01)

(58) Field of Classification Search
CPC . H01L 23/3735; H01L 23/3737; H01L 23/40; F16J 15/064; H05K 9/0015
See application file for complete search history.

(56) References Cited

U.S. PATENT DOCUMENTS

| | | | | |
|---|---|---|---|---|
| 5,880,524 A * | 3/1999 | Xie | ........................ | H01L 23/427 257/704 |
| 6,665,187 B1 * | 12/2003 | Alcoe | ..................... | H01L 23/10 165/185 |
| 7,031,162 B2 * | 4/2006 | Arvelo | ................ | H01L 23/3675 257/707 |
| 7,462,506 B2 * | 12/2008 | Kuczynski | .............. | H01L 23/26 257/682 |
| 7,944,046 B2 * | 5/2011 | Chao | ........................ | H01L 23/10 257/713 |
| 9,583,415 B2 * | 2/2017 | Yu | ........................... | H01L 23/42 |
| 9,685,393 B2 * | 6/2017 | Qiu | ........................ | H01L 23/46 |
| 2002/0056908 A1 * | 5/2002 | Brownell | ............ | F28D 15/0266 257/714 |
| 2007/0069369 A1 * | 3/2007 | Hou | ........................ | H01L 23/36 257/706 |
| 2010/0290190 A1 * | 11/2010 | Chester | .............. | H05K 7/20772 361/701 |

(Continued)

*Primary Examiner* — James Wu
*Assistant Examiner* — Michael A Matey
(74) *Attorney, Agent, or Firm* — Mentor Graphics Corporation

(57) ABSTRACT

This application discloses an device disposed on a substrate, and a heat sink disposed on the substrate over the device. The heat sink disposed on the substrate forms a cavity to hold a fluid between the heat sink and the device. The fluid can absorb heat emitted by the device and transfer at least a portion of the absorbed heat to the heat sink. A gasket can be disposed between and in contact with the substrate and the heat sink. The gasket can prevent the fluid from exiting the cavity formed by the heat sink disposed on the substrate. The heat sink can have an opening to the cavity, which can be detachably sealed by a plug. The plug can reduce a pressure within the cavity or allow removal of gas bubbles in the fluid held in the cavity.

13 Claims, 4 Drawing Sheets

(56) References Cited

U.S. PATENT DOCUMENTS

| | | | |
|---|---|---|---|
| 2015/0109735 A1* | 4/2015 | Campbell | H05K 7/20318 361/700 |
| 2016/0073548 A1* | 3/2016 | Wei | H05K 7/203 361/700 |
| 2017/0010642 A1* | 1/2017 | Cheng | H05K 7/20336 |
| 2017/0223871 A1* | 8/2017 | Sylvestre | H01L 23/34 |
| 2017/0374764 A1* | 12/2017 | Chauhan | H05K 7/20336 |

* cited by examiner

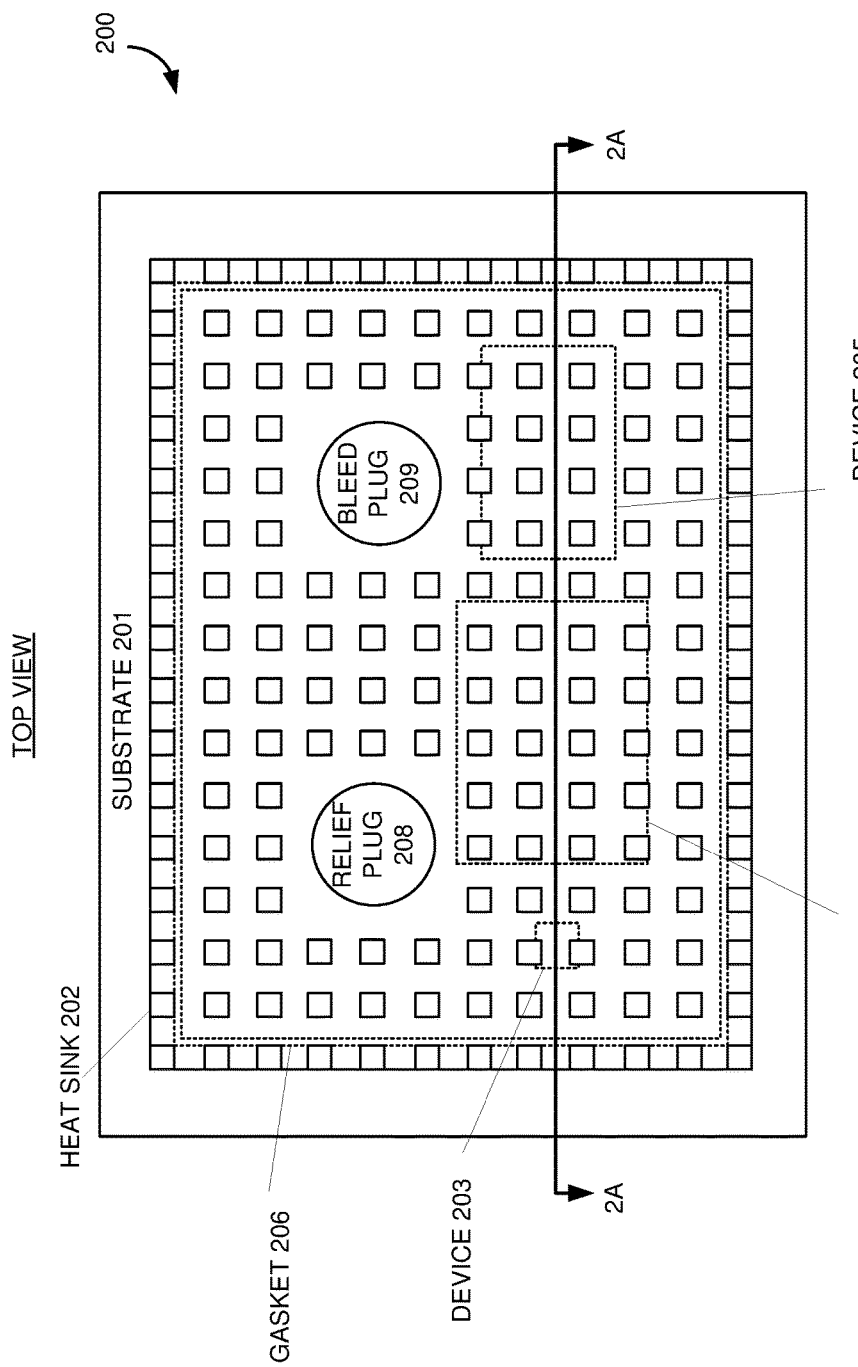

HEAT SINK INTERFACE FOR A DEVICE

TECHNICAL FIELD

This application is generally related to heat sinks for devices and, more specifically, to a liquid heat sink interface for devices.

BACKGROUND

Most electronics and mechanical devices emit heat as a by-product of their operations. One common technique to remove heat from the device includes affixing a heat sink to the device, for example, by thermally bonding the heat sink to the device with a thermal compound, such as a thermal paste or phase change material. This thermal bonding between the device and the heat sink, however, can pose challenges. One such challenge can be that the thermal compound can be difficult to remove for servicing of the device. Another challenge can be the variability in a thermal interface created by the thermal bonding. For example, the performance of the heat sink in removing heat emitted by the device can be affected by a thickness of the thermal bonding material between the device and the heat sink and the contact pressure applied. Thus, the physical application of the heat sink to the device via thermal bonding can alter the performance of the heat sink in removing heat emitted by the device. In some instances, the heat sink can be disposed on a printed circuit board coupled to multiple integrated circuits, and the heat sink can be thermally bonded to the multiple integrated circuits. Since the integrated circuits can have differing heights relative to the plane of the printed circuit board, the manufacture of the heat sink can include machining steps into the heat sink material that can be utilized to thermally bond the different height integrated circuits. This specialized machining of heat sinks can be time-consuming and expensive as well as lead to introducing thermal interface performance variability based on an accuracy of the machined step heights.

SUMMARY

This application discloses a device disposed on a substrate, and a heat sink disposed on the substrate over the device. The heat sink disposed on the substrate forms a cavity to hold a fluid between the heat sink and the device. The fluid can absorb heat emitted by the device and transfer at least a portion of the absorbed heat to the heat sink. A gasket can be disposed between and in contact with the substrate and the heat sink. The gasket can prevent the fluid from exiting the cavity formed by the heat sink disposed on the substrate. The heat sink can have an opening to the cavity, which can be detachably sealed by a plug. The plug can reduce a pressure within the cavity or allow removal of gas bubbles in the fluid held in the cavity. Embodiments will be described in greater detail below.

DESCRIPTION OF THE DRAWINGS

FIGS. 2A and 2B illustrate an example of a system with a liquid heat sink interface.

DETAILED DESCRIPTION

Illustrative Electronic System with a Multi-Height Heat Sink Interface

Figure 1:
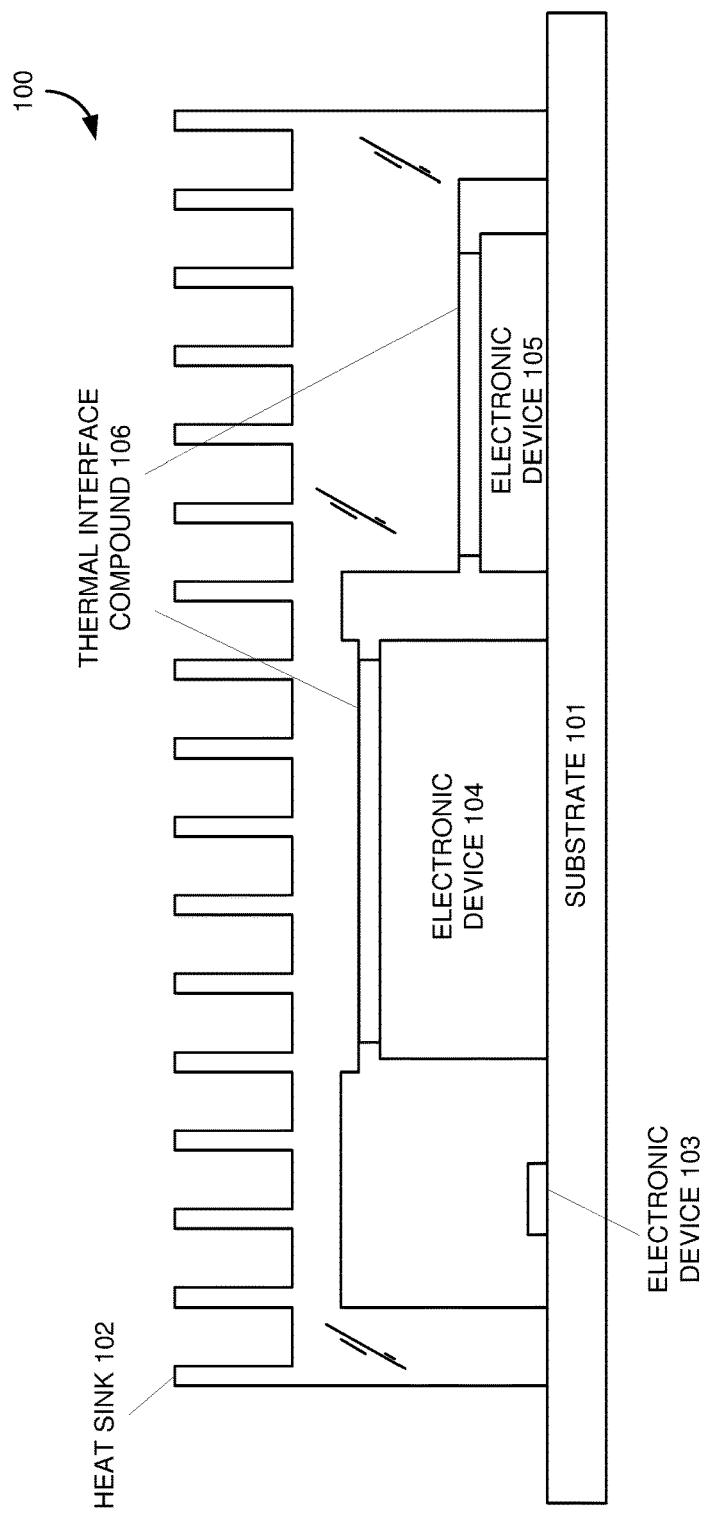
FIG. 1 illustrates an example of a system with a multi-height heat sink interface.

FIG. 1 illustrates an example of electronic system 100 with a multi-height heat sink interface. Referring to FIG. 1, the electronic system 100 can include multiple electronic devices 103-105 disposed on a substrate 101. In some embodiments, the electronic system 100 may be the portion of an emulation system and/or a prototyping system having programmable logic devices corresponding to the electronic devices 103-105 mounted on a printed circuit board corresponding to the substrate 101, for example, configured to implement functionality described in a logical design for an electronic system to be functionally verified.

The electronic system 100 can include a heat sink 102 mounted to the substrate 101 over the electronic devices 103-105. The heat sink 102 can be affixed to the electronic devices 104 and 105 through thermal bonding with a thermal interface compound 106. The thermal interface compound 106 can be a polymer-based compound with an electrically insulating and thermally conductive filler material. In some embodiments, the polymer-based compound can be an epoxy-based compound, silicon-based compound, urethane-based compound, acrylate-based compound, or the like. The electrically insulating and thermally conductive filler material can include diamond, aluminum nitride, boron nitride, aluminum oxide, or the like. In this embodiment, the electronic device 103 may not be in contact with the heat sink 102, and thus have an air gap interface between the electronic device 103 and the heat sink 102.

Since the electronic devices 103-105 have different heights and dimensions, the heat sink 102 may be specially machined to form steps in the heat sink material. During the thermal bonding process, the thermal interface compound 106 can be applied to the electronic devices 104 and 105. When the heat sink 102 is mounted to the substrate 101, the specially machined steps can couple with the thermal interface compound 106 can be applied to the electronic devices 104 and 105, which allows the heat sink 102 to become affixed to the electronic devices 104 and 105. Since the performance of the thermal interface between the heat sink 102 and the electronic devices 104 and 105 depends on the thermal interface compound 106, the mechanical tolerances of the special machined steps in the heat sink 102 and a range of pressure utilized to mount the heat sink 102 to the substrate 101 can be limited.

Electronic System with a Liquid Heat Sink Interface

Figure 2A:
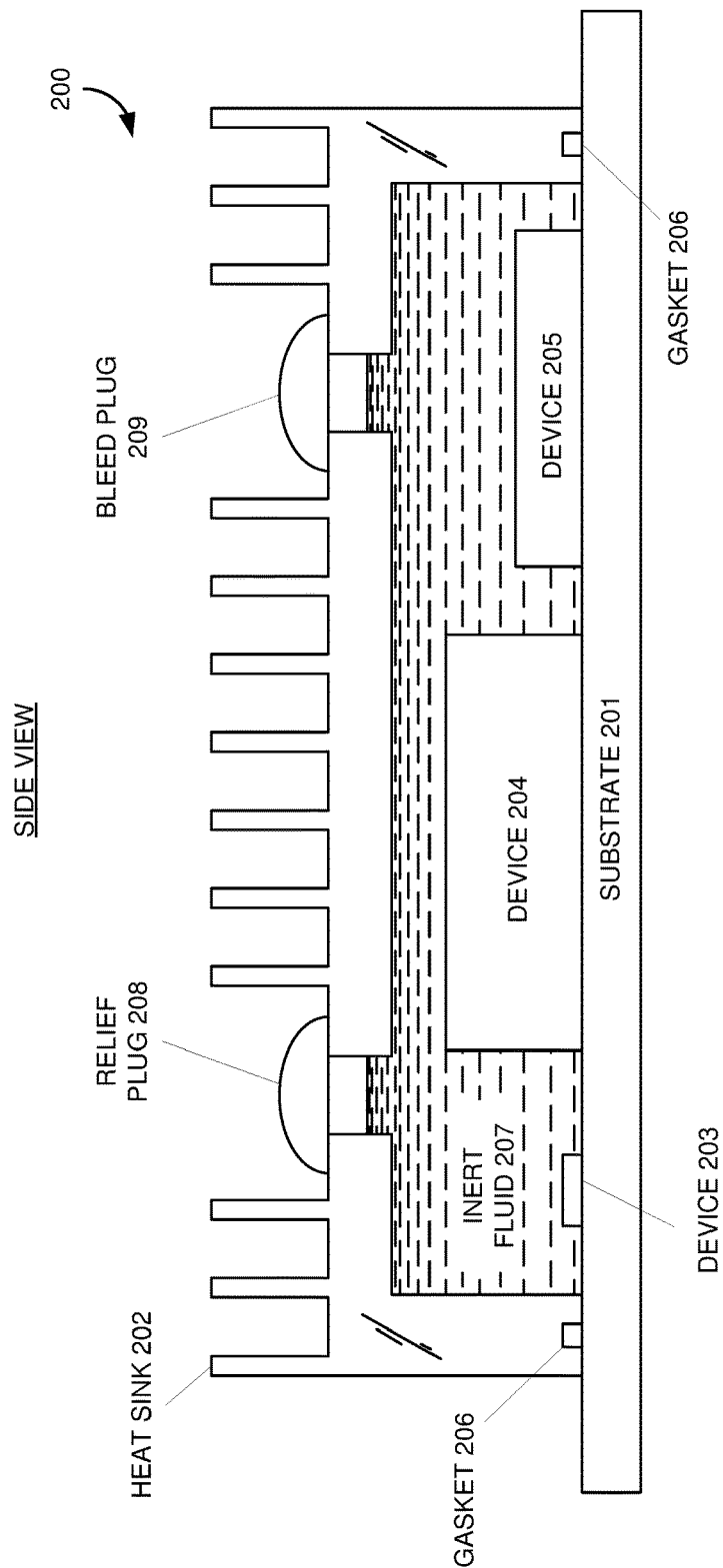

FIGS. 2A and 2B illustrate an example of a system 200 with a liquid heat sink interface. Referring to FIGS. 2A and 2B, the system 200 can include multiple devices 203-205 disposed on a substrate 201. The devices 203-205 can be electronic devices, such as integrated circuitry, resistors, light emitting diodes (LEDs), transformers, inductor coils, or the like, or mechanical devices, such as motors, industrial machinery, or the like. In some embodiments, the system 200 may be the portion of an emulation system and/or a prototyping system having programmable logic devices corresponding to the devices 203-205 mounted on a printed circuit board corresponding to the substrate 201, for example, configured to implement functionality described in a logical design for an electronic system to be functionally verified. When at least one of the devices 203-205 corresponds to a light emitting diode, the substrate 201 can be transparent, opaque, or otherwise allow transmission of light from the light emitting diode externally from the system 200.

The system 200 can include a heat sink 202 mounted to the substrate 201 over the devices 203-205. In some embodiments, the system 200 can include a gasket 206 disposed between the heat sink 202 and the substrate 201 after the heat sink 202 has been mounted to the substrate 201. The gasket 206 can be an o-ring, a packing joint, toric joint, or the like, configured to compress and create a seal between the heat sink 202 and the substrate 201, which, in some embodiments, can be made of an elastomer, rubber, or polymer having viscoelasticity. The heat sink 202 as mounted on the substrate 201 can form a cavity between the heat sink 202, the substrate 201, and the devices 203-205. The heat sink 202 may include one or more openings to allow access to the cavity.

The cavity between the heat sink 202, the substrate 201, and the devices 203-205 can hold an inert fluid 207. The inert fluid 207 can be an electrically inert fluid, such as Fluorinert® or the like, which can be an electrically insulating stable fluorocarbon-based fluid. The gasket 206 may create a seal between the heat sink 202 and the substrate 201, which prevent the inert fluid 207 from escaping the cavity at the joint where the heat sink 202 and the substrate 201 meet.

The system 200 can include a relief plug 208 configured to seal an opening in the heat sink 202. The relief plug 208 also can allow the cavity between the heat sink 202, the substrate 201, and the devices 203-205 to be filled with the inert fluid 207 through the opening in the heat sink 202. In some embodiments, the cavity can be filled with the relief plug 208 removed from the opening in the heat sink 202, or the relief plug 208 may provide a conduit to allow the inert fluid 207 into the cavity while the relief plug 208 is disposed in the opening of the heat sink 202. The relief plug 208 also can include pressure relief capabilities, for example, to reduce pressure when a temperature in the cavity rises. The relief plug 208 can include a valve to allow a volume of the inert fluid 207 to exit the cavity when the pressure in the cavity meets or exceeds a threshold pressure level. In some embodiments, the relief plug 208 can include an expansion device configured to bellow, deform, or flexibly blister based on a pressure within the cavity.

The system 200 can include a bleed plug 209 to allow for vacuum filling of the cavity between the heat sink 202, the substrate 201, and the devices 203-205 with the inert fluid 207. The bleed plug 209, when disposed in the opening of the heat sink 202, can allow for the removal of air and air bubbles from the cavity through the bleed plug 209.

By utilizing the inert fluid 207 as an interface between the heat sink 202 and the devices 203-205 disposed on the substrate 201, the system 200 can utilize a heat sink configured to be agnostic to the relative heights and sizes of the devices dispose under the heat sink, which may be simpler and/or cheaper to manufacture and utilize in assembly. The system 200 also can ensure a consistent thermal contact between the heat sink 202 and the devices 203-205 that remain unaffected by mechanical tolerances of the heat sink 202 or attachment pressure utilized while mounting the heat sink 202 to the substrate 201.

Figure 3:
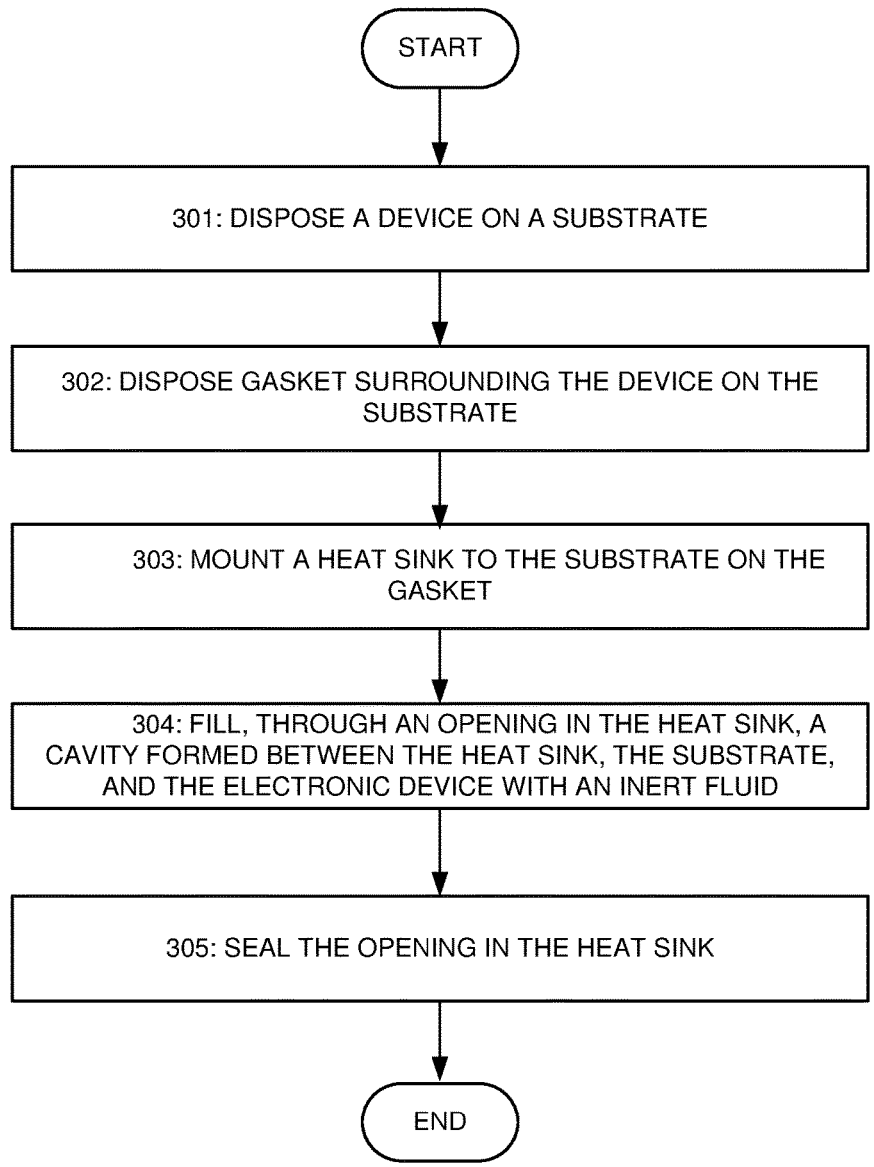
FIG. 3 illustrates an example flowchart for assembling a system with a liquid heat sink interface.

FIG. 3 illustrates an example flowchart for assembling a system with a liquid heat sink interface. Referring to FIG. 3, in a block 301, a device can be disposed on a substrate. In some embodiments, the system may be the portion of an emulation system and/or a prototyping system having programmable logic devices corresponding to the device mounted on a printed circuit board corresponding to the substrate, for example, configured to implement functionality described in a logical design for an electronic system to be functionally verified.

In a block 302, a gasket can be disposed on the substrate so that the gasket surrounds the device disposed on the substrate. The gasket can be an o-ring, a packing joint, toric joint, or the like, which, in some embodiments, can be made of an elastomer, rubber, or polymer having viscoelasticity.

In a block 303, a heat sink can be mounted to the substrate on the gasket. The mounting of the heat sink to the substrate can compress the gasket, which creates a seal between the heat sink and the substrate. The heat sink as mounted on the substrate can form a cavity between the heat sink, the substrate, and the device. The heat sink may include one or more openings to allow access to the cavity.

In a block 304, the cavity formed between the heat sink, the substrate, and the device can be filled with an inert fluid through an opening in the heat sink and, in a block 305, the opening in the heat sink can be sealed. The inert fluid can be an electrically inert fluid, such as Fluorinert® or the like, which can be an electrically insulating stable fluorocarbon-based fluid. The gasket may create a seal between the heat sink and the substrate, which prevent the inert fluid from escaping the cavity at the joint where the heat sink and the substrate meet.

In some embodiments, the system can include a relief plug configured to seal an opening in the heat sink. The relief plug also can allow the cavity to be filled with the inert fluid through the opening in the heat sink. In some embodiments, the cavity can be filled with the relief plug removed from the opening in the heat sink, or the relief plug may provide a conduit to allow the inert fluid into the cavity while the relief plug is disposed in the opening of the heat sink.

The relief plug also can include pressure relief capabilities, for example, to reduce pressure when a temperature in the cavity rises. The relief plug can include a valve to allow a volume of the inert fluid to exit the cavity when the pressure in the cavity meets or exceeds a threshold pressure level. In some embodiments, the relief plug can include an expansion device configured to bellow, deform, or flexibly blister based on a pressure within the cavity. The system also may include a bleed plug to allow for vacuum filling of the cavity with the inert fluid. The bleed plug, when disposed in the opening of the heat sink, can allow for the removal of air and air bubbles from the cavity through the bleed plug.

Conclusion

While the application describes specific examples of carrying out embodiments, those skilled in the art will appreciate that there are numerous variations and permutations of the above described systems and techniques that fall within the spirit and scope of the invention as set forth in the appended claims.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A system comprising:
a device disposed on a substrate;
a heat sink disposed on the substrate over the device to form a cavity, wherein the heat sink includes a first opening to allow a fluid to enter the cavity, wherein the cavity is configured to hold the fluid between the heat sink and the device, the fluid to absorb heat emitted by the device and transfer at least a portion of the absorbed heat to the heat sink;

a relief plug disposed in the first opening formed in the heat sink, wherein the relief plug includes a conduit configured to allow the fluid to enter the cavity through the first opening in the heat sink; and a bleed plug disposed in a second opening formed in the heat sink, wherein the bleed plug is configured to allow removal of gas from the cavity through the bleed plug and the second opening in the heat sink.

2. The system of claim 1, further comprising another device disposed on the substrate and having a different height relative to the substrate, wherein the heat sink is disposed on the substrate over both of the devices and the cavity holds the fluid between the heat sink and both of the devices.

3. The system of claim 1, further comprising a gasket disposed between and in contact with the substrate and the heat sink, wherein the gasket is configured to prevent the fluid from exiting the cavity formed by the heat sink disposed on the substrate.

4. The system of claim 1, wherein the relief plug is configured to reduce a pressure within the cavity by allowing the liquid to exit the cavity through the first opening and the relief plug.

5. The system of claim 1, wherein the relief plug is configured to reduce a pressure within the cavity by expanding at least a portion of the relief plug.

6. The system of claim 1, wherein the fluid is an electrically inert fluid.

7. A method comprising:

mounting a heat sink on a substrate disposed over a device to form a cavity between the heat sink and the device, wherein the heat sink includes a first opening to allow a fluid to enter the cavity between the heat sink and the device;

disposing a relief plug in the first opening formed in the heat sink, wherein the relief plug includes a conduit configured to allow the fluid to enter the cavity through the first opening in the heat sink;

disposing a bleed plug in a second opening formed in the heat sink, wherein the bleed plug is configured to allow removal of gas from the cavity through the bleed plug and the second opening in the heat sink; and filling, through the relief plug and the first opening formed in the heat sink, the cavity between the heat sink and the device with the fluid configured to absorb heat emitted by the device and transfer at least a portion of the absorbed heat to the heat sink.

8. The method of claim 7, further comprising disposing another device on the substrate, the another device having a different height relative to the substrate than the device, wherein the heat sink is disposed on the substrate over both of the devices and the cavity holds the fluid between the heat sink and both of the devices.

9. The method of claim 7, further comprising disposing a gasket on the substrate surrounding the device on the substrate, wherein the heat sink is mounted on the substrate over the gasket, and wherein the gasket is configured to prevent the fluid from exiting the cavity formed by the heat sink disposed on the substrate.

10. The method of claim 7, wherein disposing the relief plug in the first opening formed in the heat sink is configured to seal the first opening in the heat sink to the cavity.

11. The method of claim 7, wherein the relief plug is configured to reduce a pressure within the cavity by allowing the liquid to exit the cavity through the first opening and the relief plug or by expanding at least a portion of the relief plug.

12. The method of claim 7, further comprising, during the filling of the cavity with the fluid, removing gas from the cavity through the bleed plug and the second opening in the heat sink.

13. The method of claim 7, wherein the fluid is an electrically inert fluid.

* * * * *